United States Patent [19]
Demarest

[11] 3,938,032
[45] Feb. 10, 1976

[54] GATE PULSE POWER SUPPLY FOR STATIC ALTERNATING CURRENT SWITCH

[75] Inventor: Donald M. Demarest, Wallingford, Pa.

[73] Assignee: General Electric Company, Philadelphia, Pa.

[22] Filed: May 21, 1974

[21] Appl. No.: 472,025

[52] U.S. Cl............ 323/24; 307/252 T; 307/252 Q; 321/27 R
[51] Int. Cl.² .......................................... G05F 1/56
[58] Field of Search............ 307/252 T, 252 Q, 241, 307/242; 323/24; 321/27 R

[56] References Cited
UNITED STATES PATENTS

| | | | |
|---|---|---|---|
| 3,243,689 | 3/1966 | Perrins.............................. | 323/24 X |
| 3,405,343 | 10/1968 | Boksjö ............................. | 321/27 R |
| 3,693,069 | 9/1972 | Kelley, Jr. et al..................... | 323/24 |
| 3,729,670 | 4/1973 | Dewey ............................. | 307/252 Q |
| 3,766,409 | 10/1973 | Shuey.............................. | 307/252 T |

*Primary Examiner*—Gerald Goldberg
*Attorney, Agent, or Firm*—J. Wesley Haubner

[57] ABSTRACT

An alternating current static switch comprising two branch circuits connected in inverse parallel circuit relation and having at least three semiconductor devices in series in each branch circuit has anode-to-cathode cross connections between oppositely poled devices at each voltage level. A single gate pulse transformer having secondary windings equal in number to the number of cross connections supplies positive gate current pulses to all semiconductor devices in both branch circuits once each half cycle of impressed circuit voltage. Each secondary winding has its negative terminal connected to one cross connection and its positive terminal connected to the gates of all devices having cathodes connected to the same cross connection.

7 Claims, 1 Drawing Figure

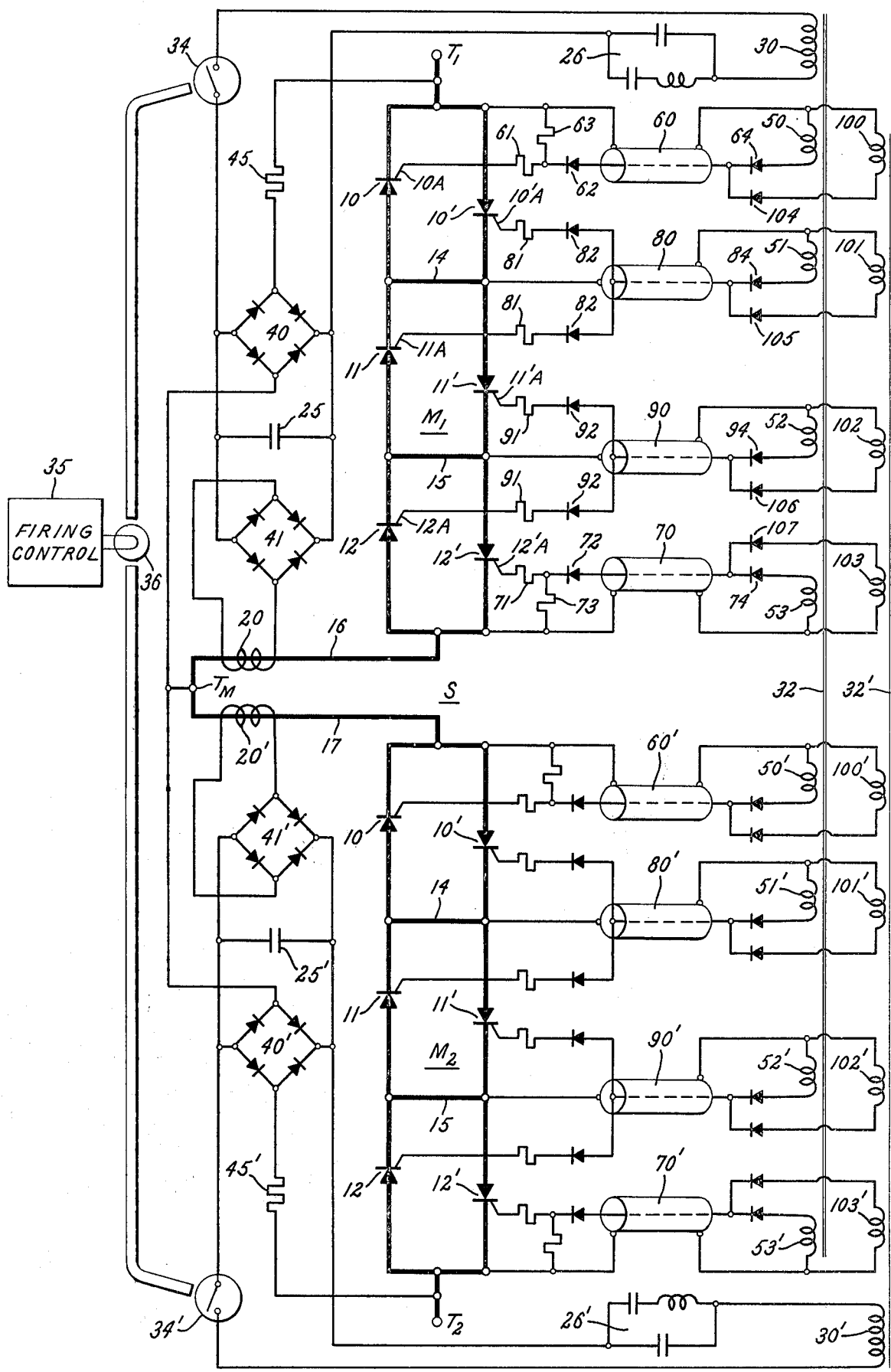

GATE PULSE POWER SUPPLY FOR STATIC ALTERNATING CURRENT SWITCH

My invention relates to alternating current static switches of the semiconductor type wherein a pair of thyristors (or a pair of similarly poled thyristor groups) is connected in inverse parallel circuit relation and alternately triggered to conduct opposite half cycles of alternating current. The invention relates more particularly to a gate pulse power supply for such switches and is especially applicable to high voltages, high current switches. Such high power static switches may comprise a plurality, or matrix, of thyristors in series and/or parallel circuit relation in each parallel branch of the circuit and thus require a significant quantity of electric power in the gate pulse circuit. The following U.S. Patents are exemplary of related prior art presently known to applicant:

U.S. Pat. No. 3,243,689 — Perrins
U.S. Pat. No. 3,766,409 — Shuey

In firing, or gating, thyristors or thyristor matrices connected to form oppositely poled parallel branch circuits of an alternating current static switch it is usual to provide a separate gate pulse transformer for each branch circuit, or at least separate secondary windings for the gate circuits of each branch. In a high voltage, high current switch made up of many thyristors in series in each parallel branch, and with each branch circuit made up of a plurality of series thyristor circuits in parallel, the use of one or more gate pulse transformers for each similarly poled matrix of thyristors requires a duplication of equipment and a considerable consumption of power. During the nonconductive half cycles of each oppositely poled branch of the circuit the gate pulse transformer associated with that branch, while energized, is ineffective, so that its energization represents an unnecessary loss of power.

It is therefore a principal object of my invention to provide improved and simplified gate pulse power supply means for an alternating current thyristor switch having three or more thyristors connected in series circuit relation in each of its parallel branch circuits.

It is another object of my invention to provide gate pulse power supply means for high voltage alternating current thyristor switches wherein gate pulse transformer power loss in the gate pulse transformer and other circuit elements is minimized.

It is a more particular object of my invention to provide, in a high voltage alternating current static switch, a single gate pulse transformer having a minimum number of secondary windings for firing all the thyristors in both inversely poled parallel branches of the circuit.

In carrying out my invention in one preferred embodiment I utilize a full wave alternating current thyristor switch having inversely poled parallel branch circuits each of which comprises at least three thyristors connected in series circuit relation. In order synchronously to fire the series thyristors in each branch circuit on opposite half cycles of applied voltage I utilize a single gate pulse transformer having a primary winding and a plurality of secondary windings arranged to be energized twice per cycle of alternating line voltage. A separate secondary winding is provided for one end thyristor in each of the parallel branch circuits, but for intermediate thyristors a common secondary winding is connected to supply gate current pulses to the gate circuits of each pair of oppositely poled thyristors (or parallel thyristor groups) having a common cathode terminal. Each thyristor is thus supplied with a gate pulse twice per cycle (i.e., once in each half cycle of applied voltage), but becomes conductive only in that half cycle when its anode is positive with respect to its cathode.

My invention will be more fully understood and its several objects and advantages further appreciated by referring now to the following detailed specification taken in conjunction with the accompanying drawing, the single FIGURE of which is a schematic circuit diagram of a static switch including a gate pulse power supply embodying my invention in one preferred form.

Referring now to the drawing, I have shown a static alternating current power switch S formed of a plurality of thyristors connected between line terminals $T_1$, $T_2$. The thyristors are assembled in two switch modules $M_1$, $M_2$ connected in series circuit relation between the line terminals and having an intermediate terminal or midpoint $T_M$. Each switch module $M_1$, $M_2$, comprises two groups of similarly poled thyristors, or matrices, connected in inverse parallel circuit relation with conductive cross connections between each oppositely poled pair of thyristors at the same voltage level. The switch modules $M_1$ and $M_2$ are alike in all respects and for simplicity the same reference numerals have been assigned to corresponding thyristors in each module.

More specifically each switch module $M_1$, $M_2$ comprises three switch sections, and each section comprises a pair of thyristors connected in inverse parallel branch circuit relation between a pair of anode-to-cathode cross connections. Similarly poled thyristors of the several series-connected sections in a module constitute one branch circuit or thyristor matrix, the oppositely poled matrices in each module being cross connected at the common terminals of each switch section.

In the illustrated embodiment of the drawing each switching module comprises three similarly poled thyristors 10, 11, 12 connected in series circuit relation between one line terminal and the midpoint $T_M$ to conduct half cycles of current in one direction and three similarly poled thyristors 10', 11', 12' connected in inverse parallel circuit relation between the same terminals to conduct half cycles of current in the other direction. These oppositely poled branch circuits are cross connected at the terminals of each switch module and at intermediate points of like voltage level between serially connected semiconductor devices in each branch circuit. Intermediate cross connectors 14, 15 between the branch circuits of each module extend between intermediate semiconductor device terminals of like voltage in each branch circuit. Each intermediate cross connector therefore constitutes a common cathode connection for one pair of oppositely poled thyristors in serially adjacent switch sections and a common anode connection for the other pair of oppositely poled thyristors in the same switch sections. The switch modules $M_1$, $M_2$ are connected, respectively, to the common terminal or midpoint $T_M$ through conductors 16 and 17, respectively, each of which constitutes the primary winding of one of two current transformers 20, 20' which will be more fully described hereinafter.

It will be understood by those skilled in the art that while I have illustrated for simplicity a single thyristor in each branch circuit of each switch section, as the thyristors 10, 10', each such sectional branch circuit may comprise a set plurality of similarly poled thyristors connected in parallel circuit relation to provide a desired current carrying capacity. Similarly while I have shown three switch sections (as 10, 10'; 11, 11'; 12, 12') in each switch module and have shown two switch modules in series circuit relation, it will be evident to those skilled in the art that each switch module may comprise more than three sections, and that more than two modules may be utilized in order to provide a switch of desired voltage rating. Thus each branch circuit of each switch module may comprise a matrix of similarly poled thyristors connected in series and each thyristor of the series may be paralleled by one or more additional thyristors.

It will also be understood by those skilled in the art that the thyristors 10, 11, 12 and 10', 11', 12' are gate controlled silicon semiconductor devices each of which has a nonconducting, or blocking, state in which it presents very high impedance to the flow of current and a conducting, or turned on, state in which it freely conducts forward current with only relatively slight voltage drop. Each thyristor includes a gating electrode which is effective to switch that thyristor abruptly from its blocking state to its turned on state when provided with a current impulse, or gating signal, while "forward" bias exists on its main electrode (i.e., the thyristor anode is positive with respect to its cathode). As is well known, such a gating signal is effective to render a thyristor conductive at any time during a half cycle in which such forward bias exists. Once conduction is initiated during any half cycle the thyristor will continue to conduct "forward" current until that current is reduced below a predetermined holding level irrespective of voltage on the gate. The time during which the thyristor is conductive in any half cycle, measured in electrical degrees from the instant of turn on, is referred to as the "conduction angle". The time during any half cycle of positive bias potential prior to the initiation of conduction, measured in electrical degrees from the prior voltage zero, is referred to as the "delay angle" or "gating angle". Gating angle may, if desired, be varied by control of the phase relation of gating impulses with respect to the initiation of forward voltage, thereby to control the magnitude of average current traversing the thyristor. In order transiently to stabilize voltage across the series connected resistors of each matrix during the transition between blocking and conducting state of the thyristors it is desirable that each thyristor be shunted by an RC circuit (not shown) comprising a resistor and a capacitor in series, as is illustrated and described in U.S. Pat. No. 3,423,664-Dewey.

In order to derive thyristor gate pulse energy from the power circuit controlled by the static switch S I provide an energy storage capacitor 25 associated with switching module $M_1$ and an energy storage capacitor 25' associated with module $M_2$. The capacitors are charged from the power circuit and have discharge circuits including gate pulse generators 26, 26', respectively. Each gate pulse generator 26, 26' is illustrated as a pulse forming network of the type described in the aforementioned Dewey patent. The output of the pulse forming networks 26, 26' is supplied at a selected instant during each half cycle of line voltage to the primary windings 30, 30', respectively, of a pair of gate pulse transformers 32, 32', respectively.

Simultaneous discharge of the capacitors 25, 25', and consequent energization of the gate pulse transformers 32, 32' is controlled by light actuated firing switches 34, 34', respectively, which are synchronously and simultaneously closed at selected instants during each half cycle of power circuit voltage by a suitable firing control unit 35 having an output light source 36. The firing control unit 35 provides primary control for the static switch S and may, if desired, include means for variably phase controlling the thyristor gates during "on", or conductive, intervals of switch operation. Desirably the firing control unit 35 is similar to the gating control described in U.S. Pat. No. 3,693,069-Kelley et al. It will of course be understood by those skilled in the art that the light pipe actuating means schematically illustrated between the firing control unit 35 and the firing switches 34, 34' is optional but is desirable for high voltage applications where the gate pulse supply circuit must be at very high voltage above ground while the firing control is preferably at low voltage.

Gate pulse power supplied by discharge of the storage capacitors 25, 25' is derived from the power circuit through two charging circuits associated with each storage capacitor. Referring for simplification to only the capacitor 25, primary or starting power is supplied through a charging circuit comprising a rectifier bridge 40 having its output terminals connected across the capacitor 25 and its input terminals connected through a series bleeder resistor 45 across the switching module $M_1$ between the midpoint $T_m$ and the line terminal $T_1$. Operating or running power during an "on" or conductive interval of switching operation is derived from a second charging circuit comprising a rectifier bridge 41 having its output terminals connected across the capacitor 25 and its input terminals connected to the secondary winding midpoint current transformer 20. Similar dual charging circuits for the capacitor 25' have been assigned like reference numerals. Such dual charging circuits are more fully described and claimed in my patent application Ser. No. 416,559, filed on Nov. 16, 1973 and assigned to the same assignee as the instant application.

It will now be apparent to those skilled in the art that the gate pulse transformers 32, 32' are simultaneously energized once during each half cycle of line voltage, the transformer 32 being energized from the capacitor 25 associated with switching module $M_1$ and the transformer 32, being energized from capacitor 25' associated with the switching module $M_2$. As will be more fully described hereinafter, secondary windings of each gating transformer 32, 32' are connected to supply gating impulses to all the thyristors in both switching modules $M_1$, $M_2$, secondary windings gating the same thyristors being connected in parallel. While a single gating transformer would be sufficient, it is desirable to provide the redundant parallel connection illustrated in order to ensure reliability in case of failure within any one of the light actuated firing switches 34, 34'.

Referring now to switching module $M_1$ and to the gate pulse transformer 32 having its primary winding 30 associated with module $M_1$ it will be observed that transformer 32 is provided with four secondary windings 50, 51, 52, 53 associated with the switch module $M_1$ and four secondary windings 50', 51', 52', 53' associated with the switch module $M_2$. The secondary windings 50, 51, 52 and 53 are connected to supply gating pulses to the thyristors of switching module $M_1$ at the voltage levels of the several switch sections which comprise that module. The secondary windings 50 and 53 at the highest and lowest levels of the switching module $M_1$ each supply gating pulses to a single thyristor, while the intermediate secondary windings 51 and 52 each supply gating pulses to two oppositely poled thyristors having a common cathode connection. The secondary windings 50', 51', 52', 53' are similarly connected to supply gating pulses to the thyristors in the switching module $M_2$. Thus in each module having N thyristors in series only (N+1) secondary transformer windings are required.

In like manner the gate pulse transformer 32' has its primary winding 30' associated with switch module $M_2$ and secondary windings 100, 101, 102, 103, 100', 101', 102' and 103' connected in parallel respectively with transformer windings 50, 51, 52, 53, 50', 51', 52' and 53'. For simplicity only the secondary winding circuits in module $M_1$ will be described in detail.

Referring now to the gating circuits in the switching module $M_1$, it will be observed that the pulse transformer secondary winding 50 is connected through a coaxial cable 60 to supply gating pulses between the cathode and a gating electrode 10A of the thyristor 10. In order to isolate the gating transformer secondary winding 50 electrically from other secondary windings of the transformer which supply the gates of other thyristors the load end of the positive central conductor in the coaxial cable 60 is connected to the gating electrode 10A through a current limiting resistor 61 and a blocking diode 62 poled to conduct positive impulses to the gating electrode 10A. Because the pulse transformer secondary winding 50 is connected to supply gating impulses to only a single transistor a load and isolating resistor 63 is connected across the gate-to-cathode circuit of the thyristor 10 in series with the resistor 61. The dummy load resistor 63 is required because the terminal pulse transformer secondary winding 50 is energized on every half cycle of power circuit voltage while the gate circuit of the thyristor 10 is conductive only on alternate half cycles. The resistor 63 serves to provide balanced loading for the secondary winding 50, and to thus prevent mismatch of the winding 50 on those half cycles when the thyristor 10 is not conductive. If the gate pulse wave shape is not critical this resistor may be omitted. The pulse transformer secondary winding 50 is connected to the input end of the coaxial cable 60 through a blocking diode 64 the purpose of which will be more fully described hereinafter.

In like manner the other terminal pulse transformer secondary winding 53 is connected to provide gating pulses to the gate electrode 12'A of the single thyristor 12' through a coaxial cable 70, a gating resistor 71, and a blocking diode 72. The winding 53 is provided with a dummy load resistor 73. The transformer secondary winding 53 is connected to the input end of the coaxial cable 70 through a blocking diode 74.

The intermediate pulse transformer secondary windings 51 and 52 are each connected in parallel circuit relation to the gating electrodes of two oppositely poled thyristors having a common cathode connection, but are otherwise similar to the terminal gating circuits described above. Specifically, the transformer secondary winding 51 is connected through a coaxial cable 80 to the cross connector 14 and in parallel circuit relation to gating electrodes 10'A and 11A of the thyristors 10' and 11 respectively the positive terminal of secondary winding 51 being connected to each such gating electrode through a blocking diode 84, the axial conductor of coaxial cable 80 and separate current limiting resistors 81 and blocking diodes 82. In similar manner the pulse transformer secondary winding 52 has its negative terminal connected through a coaxial conductor 90 and the cross connector 15 to the cathodes of thyristors 11A and 12. The positive terminal of winding 52 is connected to both gating electrodes 11'A and 12A through a diode 94, cable 90 and parallel circuits each including a resistor 91 and a blocking diode 92.

To ensure reliability in the event of a failure in any one of the light activated firing switches 34 or 34' the secondary windings 100, 101, 102 and 103 of pulse transformer 30' are connected, respectively, in parallel circuit relation with the transformer windings 50, 51, 52 and 53 through blocking diodes 104, 105, 106 and 107. It will be understood that this parallel connection of secondary windings on two pulse transformers synchronously energized provides redundancy only and is not necessary to the operation of the paired thyristor gating circuit which is a principle feature of my invention. In order to avoid loss of redundancy in the event of failure of either pulse transformer (and thus short circuit of active secondary windings) parallel-connected pairs of transformer windings are connected through isolating diodes, as the diodes 64, 74, 84, 94, 104, 105, 106 and 107.

It may now be further observed that secondary windings 50', 51', 52' and 53' of gate pulse transformer 30 are connected through coaxial cables 60', 70', 80' and 90' to gate pulse circuits for several sections of switch module $M_2$ which are similar in all respects to the gate pulse circuits described above for module $M_1$ and that a redundant source of gating energy supply is provided by the parallel connected secondary windings 100', 101', 102' and 103' on the transformer 30'. As in the case of the switching module $M_1$ the terminal transformer secondary windings 50' and 53' supply gating impulses to single transistors only and each of the intermediate secondary windings 51' and 52' and supply gating power to a pair of oppositely poled thyristors having a common cathode connection.

Referring now to the gating circuits particularly described in conjunction with the switching module $M_1$, it will be observed that in operation both gate pulse transformers 30 and 30' are simultaneously energized at selected instants during each half cycle of power circuit voltage and each pair of parallel-connected redundant secondary windings (as 50, 100; 51, 101 etc.) applies a voltage pulse to the gating electrodes connected thereto. All gating electrodes are thus impulsed twice per cycle of the alternating power circuit voltage. The associated thyristors, however, are fired only in that branch circuit, or thyristor matrix, to which forward voltage is then applied between the switch terminals $T_1$, $T_2$. Thus the thyristors 10, 11 and 12 are fired only on alternate half cycles of one polarity while the thyristors 10', 11' and 12' are fired on alternate half cycles of the opposite polarity. Because all intermediate pulse transformer secondary windings (i.e., intermediate the windings associated with a single thyristor at opposite terminal ends of each switching module) are each connected to fire pairs of oppositely poled thyristors having a common cathode I am able to utilize a single pulse transformer for both oppositely poled branch circuits of an alternating current static switch. As previously stated, the second gate pulse transformer illustrated in the drawing may be omitted if desired. It is illustrated only to provide a redundant source of supply for the purpose of enhancing reliability. By thus utilizing a single pulse transformer I am able to reduce the amount of apparatus required and minimize the power loss in the gate pulse circuits of a high voltage alternating current static switch.

It will be understood by those skilled in the art that in applying my invention with some thyristor types it is desirable to utilize relatively short gate pulses in order to minimize the application of gate-to-cathode voltage during negative half cycles of anode-to-cathode voltage on each thyristor. To avoid high loss or damage to certain thyristor types it is preferable that pulse duration be of the order of one third to one half the conductive interval in any half cycle.

While I have described a single preferred embodiment of my invention by way of illustration many modifications will occur to those skilled in the art and I therefore wish to have it understood that I intend in the appended claims to cover all such modifications as fall within the true spirit and scope of my invention.

What I claim as new and desire to secure by Letters Patent of the United States is:

1. Alternating current static switching apparatus for an electric power circuit comprising two oppositely poled branch circuits connected in parallel circuit relation between a pair of terminal cross connections, each said branch circuit including an equal number of at least three gate controlled semiconductor devices in series circuit relation and each said device having an anode, a cathode and a gating electrode, serially connected semiconductor devices in each said branch circuit having common anode-cathode terminals defining intermediate operating voltage levels in each said branch circuit, intermediate cross connections between common anode-cathode terminals at like intermediate voltage levels in each of said branch circuits, said terminal and intermediate cross connections defining a plurality of serially connected switch sections each including at least two oppositely poled semiconductor devices, and common gate pulse supply means connected to supply current pulses between the cathodes and gating electrodes of all said semiconductor devices once during each half cycle of alternating voltage impressed between said switch terminals.

2. Alternating current static switching apparatus according to claim 1 wherein said gate pulse supply means includes a gate pulse transformer having a primary winding and a plurality of secondary windings each having positive and negative terminals, means connecting the negative terminal of each said secondary winding to a single one of said cross connections, and means connecting the positive terminal of each said secondary winding to the gating electrodes of all semiconductor devices having their cathodes connected to the negative terminal of the same secondary winding.

3. Alternating current static switching apparatus according to claim 2 wherein said switch comprises N sections and said gate pulse transformer has (N+1) secondary windings, two terminal secondary windings having their negative terminals connected respectively to said terminal cross connections and each intermediate secondary winding having its negative terminal connected to one said intermediate cross connection.

4. Alternating current static switching apparatus according to claim 2 wherein said transformer windings are connected to said cross connections and to said gate electrodes through coaxial cable and each gate electrode connection includes a blocking rectifier.

5. Alternating current static switching apparatus according to claim 3 which includes also an isolating load resistor connected across each said terminal secondary winding.

6. Alternating current static switching apparatus according to claim 1 including at least two switch modules each of which comprises at least three switch sections and wherein said gate pulse supply means comprises separate means for simultaneously deriving current pulses from each of said modules respectively at selected instants during each half cycle of alternating power circuit voltage and supplying said pulses redundantly to all semiconductor devices in both said modules.

7. In an alternating current static switching apparatus according to claim 1 including at least two switch modules each of which comprises at least three switch sections, current transformer means connecting said modules in series circuit relation, said gate pulse supply means including two gate pulse transformers each having a primary winding and a plurality of secondary windings, means including said current transformer means and responsive to an electrical characteristic of voltage applied across said switch modules, respectively, for separately impressing unidirectional current pulses upon said primary windings synchronously and simultaneously once each half cycle of power circuit voltage, each said pulse transformer having a number of secondary windings equal to the total number of cross connections in said switch modules, means connecting the negative terminals of one said secondary winding of each said transformer to said cross connections respectively, pairs of said secondary windings commonly connected to each said cross connection having their positive terminals connected together and to the gating electrodes of all semiconductor devices having cathodes connected to the same said cross connection.

* * * * *